(12) United States Patent
Keaveney et al.

(10) Patent No.: US 7,042,970 B1
(45) Date of Patent: May 9, 2006

(54) PHASE FREQUENCY DETECTOR WITH ADJUSTABLE OFFSET

(75) Inventors: Michael Keaveney, Co. Limerick (IE);
William Hunt, Co. Limerick (IE);
Michael Tuthill, Co. Limerick (IE)

(73) Assignee: Analog Devices, Inc., Norwood, MA (US)

( * ) Notice: Subject to any disclaimer, the term of this patent is extended or adjusted under 35 U.S.C. 154(b) by 758 days.

(21) Appl. No.: 09/882,512

(22) Filed: Jun. 15, 2001

(51) Int. Cl.
*H03D 3/24* (2006.01)

(52) U.S. Cl. ............ 375/371; 375/373; 375/374; 375/375; 375/376

(58) Field of Classification Search ........... 375/376, 375/374, 120, 373, 354, 362, 371, 375; 331/1; 327/2, 3, 7, 149
See application file for complete search history.

(56) References Cited

U.S. PATENT DOCUMENTS

| | | | | |
|---|---|---|---|---|
| 4,378,509 A * | 3/1983 | Hatchett et al. | ............... | 327/5 |
| 4,795,985 A * | 1/1989 | Gailbreath, Jr. | ............... | 327/158 |
| 4,970,475 A * | 11/1990 | Gillig | ............... | 331/25 |
| 5,459,755 A * | 10/1995 | Iga et al. | ............... | 375/376 |
| 5,986,512 A * | 11/1999 | Eriksson | ............... | 331/16 |
| 6,002,273 A * | 12/1999 | Humphreys | ............... | 327/3 |
| 6,049,233 A * | 4/2000 | Shurboff | ............... | 327/2 |
| 6,150,889 A * | 11/2000 | Gulliver et al. | ............... | 331/14 |
| 6,157,218 A * | 12/2000 | Chen | ............... | 327/7 |
| 6,192,094 B1 * | 2/2001 | Herrmann et al. | ............... | 375/375 |
| 6,327,319 B1 * | 12/2001 | Hietala et al. | ............... | 375/374 |
| 6,359,945 B1 * | 3/2002 | Doblar | ............... | 375/357 |
| 6,636,079 B1 * | 10/2003 | Koyama | ............... | 327/7 |

\* cited by examiner

*Primary Examiner*—Kenneth Vanderpuye
*Assistant Examiner*—Jason M. Perilla
(74) *Attorney, Agent, or Firm*—Wolf, Greenfield & Sacks, P.C.

(57) ABSTRACT

A phase detection apparatus is described for use in a phase lock loop (PLL). The apparatus has a first input for a reference signal, a second input for a loop feedback signal and an output for the phase difference signal. Two D-type flips flops are provided, the first being clocked with the reference signal and the second with the loop feedback signal. The output of the second flip-flop is delayed relative to the first flip-flop, thereby effecting minimal overlap, when using the phase detection apparatus in a fractional-N phase lock loop, of the interpolator activity with that of the charge pump.

24 Claims, 15 Drawing Sheets

Tri-state PFD

FIGURE 3. Operation of Prior Art Tri-state PFD and Charge Pump with perfectly matched up and down currents FIGURE 4. Prior Art Fractional-N PLL FIGURE 5. PFD transfer function with non-linearity due to mis-match FIGURE 6. Prior Art PFD/Charge Pump with bleed current FIGURE 7: Prior Art FIGURE 8. Tri-state PFD with phase offset FIGURE 9. Operation of PFD/Charge Pump with different reset delays: $\tau 1, \tau 2$ FIGURE 12. Operation of PFD/Charge Pump with delay on reset to Nclk

PHASE FREQUENCY DETECTOR WITH ADJUSTABLE OFFSET

FIELD OF THE INVENTION

The invention relates to phase frequency detectors and particularly to a phase frequency detector in a phase lock loop (PLL) based frequency synthesiser.

BACKGROUND TO THE INVENTION

Phase locked loops (PLL) are useful building tools available from several manufacturers as a single integrated circuit. A typical PLL is shown in FIG. 1 and incorporates a phase frequency detector (100), a charge pump (110), a low pass filter element (120) and a voltage controlled oscillator (VCO) (130). A clock signal Rclk is provided as a first input to the phase detector (100) and a feedback signal, Nclk, the output of a frequency divider, is provided as a second input. In this known phase locked loop, PLL, based frequency synthesiser, the outputs of the tri-state phase/frequency detector, PFD (100), are used to drive the charge pump (110).

Although shown as an integer- N PLL in FIG. 1, such PLL's can be modified to fractional -N by using an interpolator to control the frequency divider. The tri-state PFD has particular application for fractional-N frequency fractional synthesis, as noisy digital activity may be performed while the PFD is in it's off state. However, the use of the these PFD in fractional-N phase detectors suffers from a problem associated with its non-linearity behaviour around the origin. Other types of phase detectors (e.g. XOR based) do not suffer from problems associated with non-linearity problems, but do have other problems that obviate their effectiveness in use in these applications. If the problem of non-linearity could be overcome the PFD would be the preferred detector for the fractional-N PLL application.

FIG. 2 details the PFD (100) that can be used in the circuitry of FIG. 1. It comprises two D-type flip-flops (201, 202), the D input of both being tied to a logic high. A reference frequency Rclk clocks a first flip-flop (201) and a signal frequency Nclk clocks the second flip-flop (202). The outputs of both flip flops are input to an AND gate (203), the output of which is the input to a delay element (204), the output of which is then input to the reset input of both flip-flops (201, 202). It will be understood that both flip flops are therefore provided with the same signal to their respective reset inputs. The effect of this input from the AND gate (203) and delay element (204) ensures that the output of each flip-flop has a minimum pulse width. The output of each flip-flops drives an individual charge pump (205, 206), the charge pumps being connected at a common node (207) that provides the output, Icp, of the circuit, the output, Icp, being the combination of current from the first and second charge pumps.

The charge pump output, Icp, can have three states, "up" active, "down" active and "off", the states being driven from the outputs of the flip-flops of the PFD. When "up" is active Icp sources current Icp (205). When "down" is active, Icp sinks current Idn (206). When neither pump-up (205) nor pump-down (206) is active, Icp is zero so the charge pump is in the "off"state. If Iup and Idn are perfectly matched then Icp is also zero when both pump-up and pump-down are active.

It will be understood therefore that the PFD/charge pump combination outputs a net pulse of source current, Iup, if the Nclk phase lags the Rclk phase, the pulse width being proportional to the phase difference between the two signals. Similarly, a net sink current pulse, Idn, is output if the Nclk phase leads the Rclk phase, again of width proportional to the phase error.

In any cycle, the presence of the delay element (204) ensures that both "up" and "down" outputs of the PFD circuitry are active for at least the period τ (known as the anti-backlash delay), before the flip-flops are reset. This ensures that there is no dead-zone in the phase detector when the phase error is very small. The anti-backlash delay is typically chosen to be at least as long as the turn-on time of the current sources. A timing diagram shown in FIG. 3 illustrates an example where the Nclk phase leads the Rclk phase, i.e. the VCO output frequency is too high. The net result is that a negative current pulse, of width proportional to the input phase error, is output (Icp) from the charge pump which acts to slow down the VCO output frequency. When the PLL is in lock with small phase error, the tri-state charge pump is only on for the anti-backlash period, which is typically a small fraction of the reference period. This gives the tri-state PFD good immunity to substrate noise.

As seen in FIG. 1, the output of this circuitry is low pass filtered (120) before driving the VCO (130), the frequency divided output of which is used as the feedback loop signal and the input Nclk to the second flip flop (202). The presence of a positive or negative pulse from the phase detection circuitry causes the VCO (130) to change frequency and phase until Rclk=Nclk in both frequency and phase. The output of the phase detection circuitry is therefore adopting a zero value and the VCO (130) is locked onto that frequency.

As discussed previously, the integer -N circuitry may be modified to form a fractional-N PLL, such as that shown in FIG. 4. The same reference numerals are used for similar components. Such a circuit incorporates a fractional interpolator (401) to control the N divider (402) in the feedback loop. Typically, an interpolator such as a sigma-delta modulator with an output containing a DC component equal to the interpolated fractional value and an error component high pass shaped versus frequency is used to effect a modulation of the phase of the Nclk edge at the PFD input in such a way that its average value is equal to the phase of reference input to the PFD, and with noise shaping in the modulator ensuring that quantised phase noise is shaped to have a high frequency characteristic which is subsequently attenuated by the low pass loop filter (120). A typical PFD/charge pump transfer function is shown in FIG. 5. Positive output charge corresponds to net "up" current out of the charge pump, negative output charge corresponds to net "down" current. Mismatch between the "up" and "down" charge pump currents causes a non-linearity in the PFD/charge pump transfer function in the region of the zero input phase error point. This non-linearity generates harmonics of the shaped quantised phase noise signal on Nclk, which can alias down in-band when sub-sampled at the PFD reference rate. The aliased quantisation noise typically looks like discrete spurs at frequencies of multiples and sub-multiples of the reference frequency divided by the modulus of the interpolator. With dither added to the interpolator, the aliased frequencies spread out into finer frequency bins and looks more like broad-band noise, which results in degraded phase noise performance out of the synthesiser.

In order to obviate this problem it is possible to utilise a charge pump with sufficiently low mis-match so that the aliasing effect is negligible. Such a charge pump is however costly to make. An alternative solution is to add a fixed phase offset to the input phase error signal so that operation of the PFD and charge pump is biased away from the zero phase point, thus avoiding the non-linearity region.

The offset should be large enough to ensure that the Nclk edge modulates either the width of the "up" pulse OR the width of the "down" pulse and not ever both. When the Nclk edge location is modulated by the sigma-delta modulator, the offset should be greater than the largest phase deviation effected by the sigma-delta output from its average output value. For example, a suitable fractional interpolator such as a 3rd order MASH sigma-delta modulator generating interpolated fractional values between 0 and 1, outputs, once every clock cycle, one of eight integer values that can lie in the range −3 to +4 inclusive. This implies that the worse case deviation of an Nclk edge around its nominal edge location is within +/−4 RF clock cycles and hence an input phase offset in the PFD, that corresponds to 4 RF clock cycles should be sufficient.

The aforementioned PFD problem is specific to fractional-N PLL's. Prior art PFD structures tend to address additional problems and examples are described in Chapter 5 of *Frequency Synthesis By Phase Lock: William F Egan 2nd Edition Wiley Interscience* which refers to dead-zone and cross over problems that are characteristic of standard tri-state PFD architecture when operating close to the zero phase error point. If the phase detector's operating point moves into the dead-zone region the loop is effectively open and this results in a large increase in noise at the VCO output. Just out-side this dead-zone region the detector's gain response is highly non-linear. As the input error increases the detector's gain linearity improves as in this case the up or down pulses are wide enough to turn the current sources on to their final value, producing a net output charge proportional to the input phase error.

A widely used solution to the dead-zone problem is to insert a delay, t, in the reset path to both flip-flops as shown in FIG. 2. This is what is shown in FIG. 2 and its operation has been described above. The key idea here is to ensure that, near zero phase difference, both current source outputs are produced rather than neither. This always produces an output response, which is the difference between the up and down current pulses.

This solution for eliminating the dead-zone works well for an Integer-N PLL where monotonicity rather than linearity in the phase detector transfer function is sufficient to maintain low noise performance. Up/down current mismatch does, however, cause reference spur side-bands to appear around the PLL output frequency. In an Integer-N PLL the reference may only be a decade above the loop bandwidth and thus reference spurs will see limited attenuation by the low pass loop filter response. Reference spurs are much less of an issue in a fractional-N synthesizer as the much higher offset reference spurs are greatly attenuated by the loop. However, the non-linearity due to mismatch poses a problem specific to fractional-N, particularly when a high order noise shaping based fractional interpolator is used. The non-linearity causes harmonic distortion of the noise shaped phase signal on the Nclk input to the PFD and these harmonic distortion products can alias down inside the loop bandwidth due to the sub-sampling operation of the PFD.

Egan describes alternative solutions other than inserting the anti-backlash delay 30 element, to the deadzone and cross over distortion problem. One of these is the use of a constant bleed current, such as that shown in FIG. 6, as a solution to the crossover distortion problem. This works on the principle that, when the PFD is inside a PLL, the feedback loop acts to bring the average phase detector output to zero, hence a phase offset will be produced at the input to the PFD so that an appropriate opposite polarity pulse of current is output to cancel, on average, the charge due to the constant bleed current. Thus, steady state operation of the phase detector in the PLL is biased away from the zero phase error point, thus avoiding the cross-over distortion problems.

While the average or DC output of the detector is zero, the constant bleed along with the regular pulse of correction current will produce an AC error signal at the detector output. This AC signal will have a strong fundamental component at the reference frequency and lower magnitude components at harmonics of the reference frequency all of which will produce FM spur side-bands at the PLL output. The strong fundamental component produced by this constant bleed method is the most troublesome as this gets the least attenuation from the loop filter.

Egan further refers to U.S. Pat. No. 4,970,475 of Gillig the disclosure of which is incorporated herein by way of reference and which describes a pulsed bleed solution to the cross-over distortion problem which works in a similar way to the constant bleed solution, but with a reduced spur component at the reference fundamental frequency. An example of such a circuit is shown in FIG. 3 of Gillig. In this circuit two flip flops are provided, the inputs to both flip flops being tied to a logic high. The first flip flop is clocked with a reference signal whereas the second flip flop is clocked with a variable frequency feedback signal. The outputs of the flip flops are ANDed and the resulting AND gate output delayed by a delay element. The output of the delay element is then used to reset one of the flip flops while the output of the AND gate prior to the delay element is used to reset the other flip flop. Each of the flip flop outputs is used to enable a charge pump—a negative polarity source and a positive polarity source, the output of the circuit being the common node between the two charge pumps. The circuit maintains a lock condition in a phase locked loop by extending the DOWN pulse enabling the negative polarity charge pump to the same width as the UP pulse that enables the positive pump; thereby creating a net zero charge.

Alternative embodiments to the solution addressed by Gillig are shown in FIGS. 6, 7 and 9 (also shown in FIG. 5.36 of Egan) of his Patent by introducing an equal delay in the path controlling the correcting current. This additional delay causes the correcting pulse to overlap with the bleed pulse in time so that the residual output is minimised, thus reducing the reference spur component further. This is a significant improvement in an integer-N PLL but is much less so in a fractional- N PLL. This is because in the fractional -N PLL, the residual spurs in the illustrated example of FIG. 3 of Gillig tend to be already sufficiently attenuated by the loop.

As well as being solutions to the dead-zone and cross over distortion problems, as described by Egan, this input phase offset produced by either the constant bleed or the pulsed bleed implementation of Gillig provides a way to avoid the up/down mismatch non-linearity that causes aliased in-band noise in a fractional-N PLL. If the phase offset is larger than the peak phase deviation on the Nclk edge, then the Nclk edge modulates either the up or down current pulse width, but not both. The constant bleed current method carries additional broad-band noise and the fact that it is on over the complete reference cycle means that it is to susceptible to noise and interference pick-up.

Of particular concern, specific to a fractional-N synthesizer, is noise coupling from the fractional interpolator circuitry when it is on the same substrate as the charge pump circuit. While the noise shaped output of the interpolator has a spectrum with little energy inside the loop bandwidth, the digital switching activity internally in the interpolator has significant energy in its spectrum at frequencies lower than the PLL bandwidth. Substrate noise arising from switching activity at these frequencies couples through to the charge pump while Icp is on, resulting in noise side-bands appearing around the carrier at offsets equal to the noise frequency. Hence, it will be appreciated that the always on bleed current solution, while reducing the level of aliased spurs, can increase the overall in-band noise and spur level due to substrate coupling. The inherent noise produced by the bleed current device also adds to the in-band noise.

The implementation of FIG. 3 of Gillig is an improvement on constant bleed because the pulsed bleed current source is only active for a fraction of a reference cycle which means it's broad-band noise contribution will be lower. However, because the reset to the reference flip-flop is delayed, the PLL will act to force the phase of Fv (or Nclk) to lead the reference (or Rclk). The implication of this is that the potential for interference from the interpolator, (the activity of which is triggered from the Nclk edge), getting into the charge pump is maximised. This hazard is illustrated in the timing diagram of FIG. 7.

There is therefore a requirement for a device that provides an alternative solution to the the problems addressed by the bleed current and the Gillig solutions, and which does not substantially effect an incrementation of noise within the circuitry.

SUMMARY OF THE INVENTION

These shortcomings of the prior art, and others, are addressed by the phase detection apparatus of the present invention. The provision of a delay element adapted to extend the trailing edge of the output of the flip flop being clocked with the feedback signal addresses the problem of overcoming the non-linearity problem. Furthermore, which is particularly important for fractional -N phase detection apparatus, the delay of the trailing edge of the feedback clocked flip flop relative to the reference clocked flip flop, moves the activity of the interpolator away from the charge pump activity, thereby reducing any cross-talk noise, when the apparatus is operating inside a PLL.

In accordance with one embodiment of the present invention, a phase detection apparatus or device for generating a phase difference signal for use in a phase lock loop (PLL) is provided. The apparatus has a first input for a reference signal, a second input for a loop feedback signal and outputs for the phase difference signal, and comprises a first storage element having a first clock input, a reset input and an output, and a second storage element having a second clock input, a reset input and an output. A logic element for logically combining the outputs of the first and second storage elements is provided, and has inputs coupled to the outputs of the two storage elements and an output. A delay element is coupled to the output of the logic element, the delay element having an output connected to the reset element of the second storage element. The reference signal is input to the first storage element and the loop feedback signal is input to the second storage element, the provision of the delay at the reset input to the second storage element effects a delay of the output of the second storage element with regard to the output of the first storage element.

In a preferred embodiment a second delay element coupled to the output of the logic element is provided. The second delay element has an output coupled to the reset element of the first storage element and the delay introduced by the second delay element to the first storage element is less than the delay introduced by the first delay element to the second storage element.

In an alternative embodiment the second delay element is coupled between the logic element and the first delay element, the output of the second delay element being coupled to the reset element of the first flip flop and the input of the first delay element.

Desirably, the logic element comprises a logic AND gate.

The two storage elements are preferably flip flops, and more preferably D type flip flops and further comprise data inputs coupled to a logic high.

The output of the first storage element and the output of the second storage element are desirably coupled by a first current source having an enable input coupled to the output of the first storage element and a second current source having an enable input coupled to the output of the second storage element, the first and second current sources being coupled to form the output for the phase difference signal.

Preferably, the phase detection apparatus is a tri-state phase frequency detector.

In preferred embodiments, the delay element introduces a delay in the trailing edge of the second storage element relative to the trailing edge of the first storage element, the delay desirably being programmable.

Desirably, the delay is at least greater than the maximum deviation of the phase of the second storage element clock input.

In an alternative embodiment, the invention provides a phase detection apparatus also comprising: a first storage element having a clock input, a reset input and an output, and a second storage element having a clock input, a reset input and an output. Similarly to the first embodiment, a logic element for logically combining the outputs of the first and second storage element is provided, the logic element having inputs coupled to the outputs of the two storage elements and an output. In this embodiment, however, a stretching element for effecting a stretching of the trailing edge of the output of one of the first and second storage elements is provided, the provision of the stretching element effecting a stretching of the trailing edge of the output of one of the first and second storage elements, such that when used in a PLL, a compensating phase offset is introduced at the PFD input by the loop.

This embodiment may additionally comprise a delay element coupled to the output of the logic element, the delay element having an output coupled to the reset element of the second storage element.

The output of the delay element is optionally further coupled to the reset element of the first storage element.

The stretching element for effecting a stretching of the trailing edge of the output of one of the first and second storage elements desirably stretches the trailing edge output of the first storage element relative to the trailing edge output of the second storage element.

Optionally, the stretching element stretches the trailing edge output of the second storage element relative to trailing edge output of the first storage element.

In one embodiment the stetching element is located at the output of the first storage element. In another embodiment it is located at the output of the second storage element.

The phase offset is desirably a delay in the trailing edge of the output of the second storage element relative to the first storage element, and more desirably is programmable.

Typically, the delay is at least greater than the maximum deviation of the phase of the second storage element clock input.

The invention also provides a phase lock loop apparatus having a reference signal input and an oscillator output, the apparatus comprising: a filter element having an input and an output, controllable oscillator means having an input coupled to the output of the filter element and an output adapted to produce the oscillator output, a frequency dividing device having a first input coupled to the output of the oscillator output and an output for producing a feedback loop signal, and a phase detection apparatus as hereinbefore described.

Further objects, features and advantages of the present invention will become apparent from the following description and drawings.

DETAILED DESCRIPTION OF THE DRAWINGS

Figure 8:
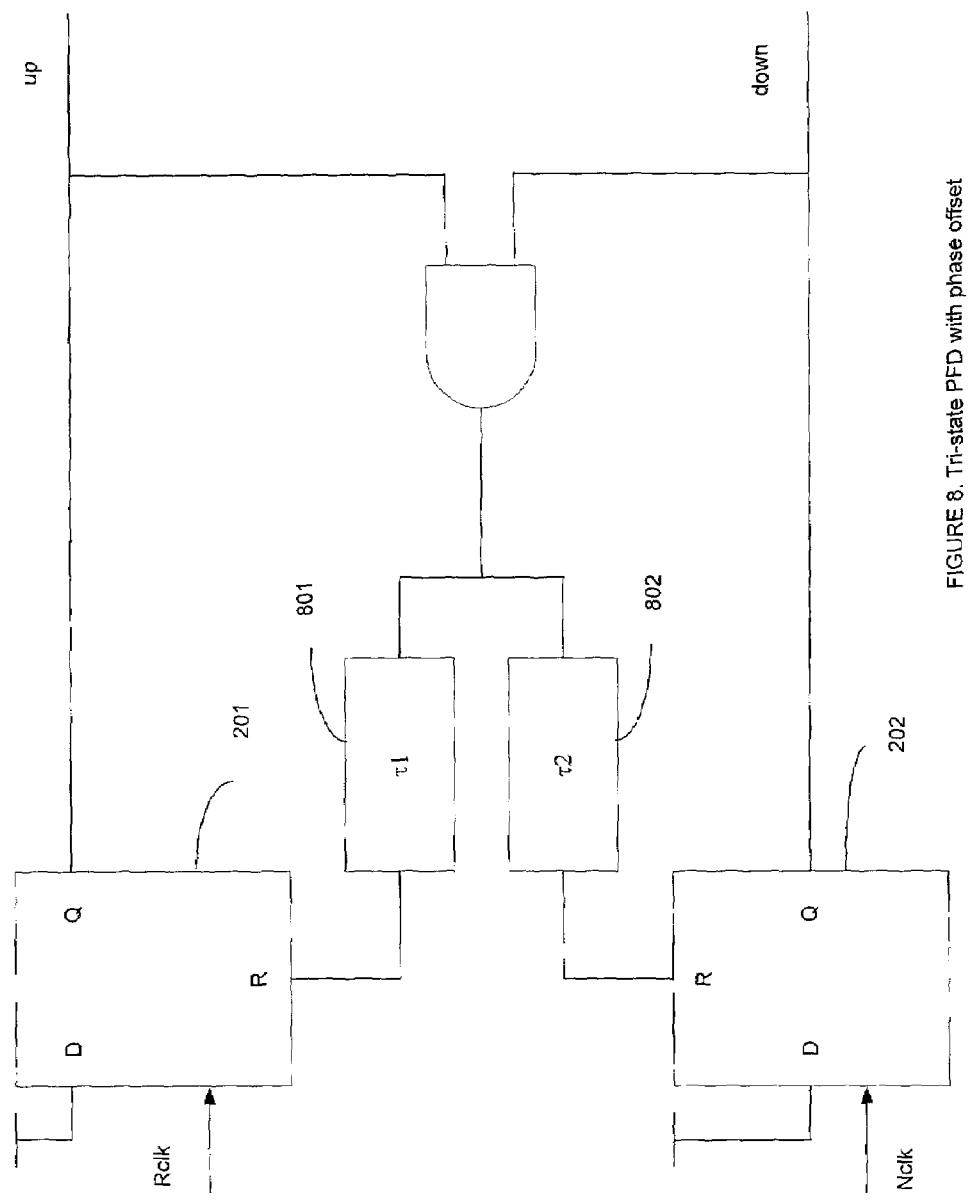
FIG. 8 shows a PFD with phase offset means according to a first embodiment of the present invention.

FIGS. 1 to 7 have been hereinbefore described with reference to the prior art. FIG. 8 shows a PFD with phase offset according to a first embodiment of the present invention for use with an interpolator circuit, which illustrates a way of introducing a phase offset at the PFD input by incorporating different "anti-backlash" delays for the up and down flip flops in the PDF. The same reference numerals are used for similar components. Similarly to that described with reference to the prior art circuits, the output of the two flip flops (201, 202) is presented as an input to the AND gate. In this embodiment the present invention differs from the prior art in that the output of the AND gate is then input to two different delay elements (801, 802). The output from each delay element is then input to the reset elements of the two flip flops. It will be appreciated that each flip flop is therefore provided with a different input to its reset element.

Figure 9:
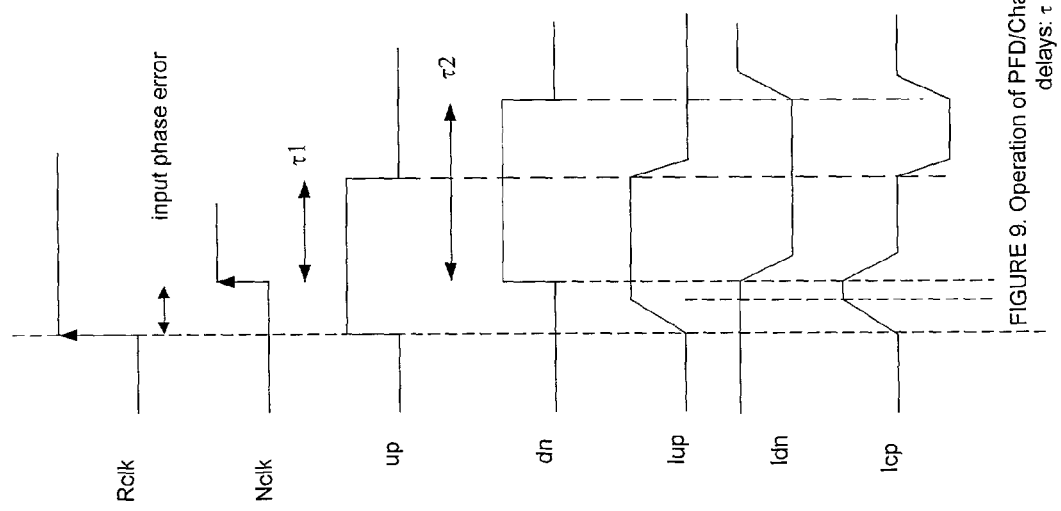
FIG. 9 shows the operation of a PFD/charge pump combination according to the embodiment of FIG. 8.

The timing diagrams in FIG. 9 show an example where $\tau 2$ is set greater than $\tau 1$. Since the loop acts to bring the average value of Icp to zero, the time difference between the delays, $\tau 1 - \tau 2$, corresponds to the phase offset that will be introduced at the PFD inputs in closed loop. Therefore, in order to ensure that only either up or down current pulse is modulated by the interpolator, a phase offset corresponding to the peak deviation of the interpolated phase on Nclk is introduced at the PFD to ensure that the interpolator only modulates up current pulse widths. This delay of Nclk relative to Rclk is important for fractional-N PLL applications as the Nclk edge initiates the period of noisy digital activity in the interpolator circuit of the fractional - N synthesizer. The introduction of a lag on the Nclk edge relative to the Rclk edge offsets this activity away from periods during which the charge pump is active, thereby minimising substrate noise coupling.

Figure 1:
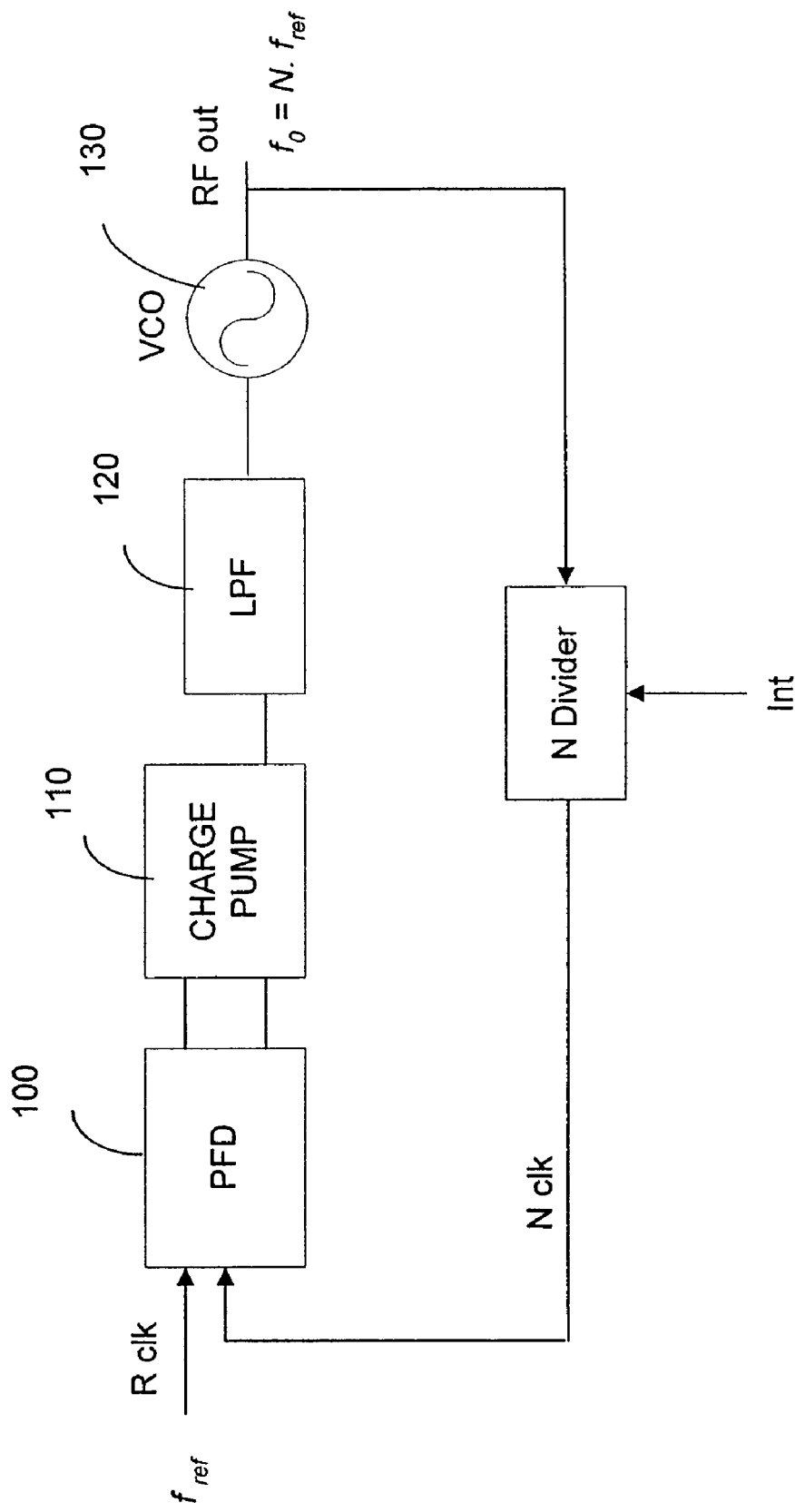
FIG. 1 shows a known Integer-N Phase locked loop (PLL)
Figure 2:
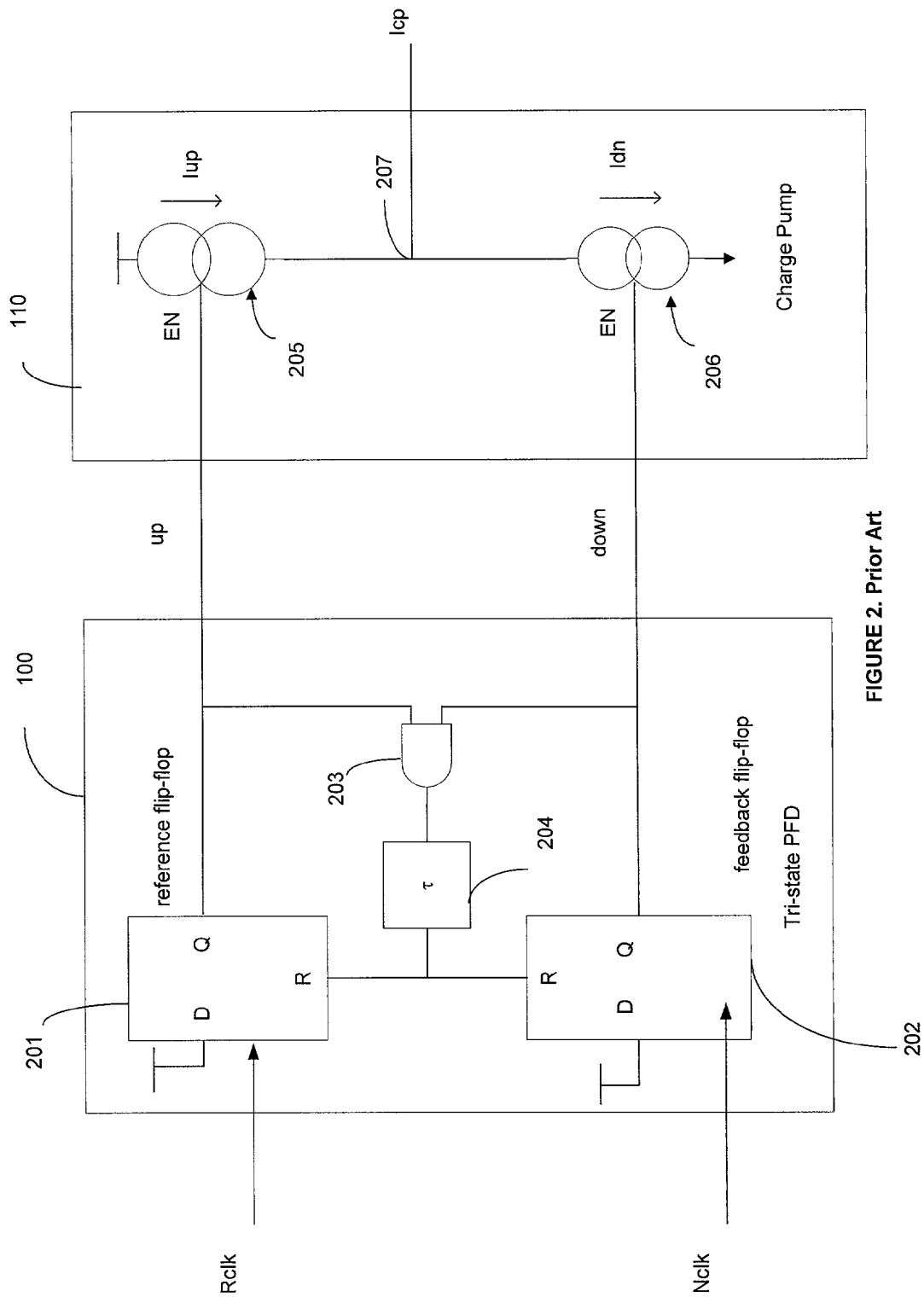
FIG. 2 shows a known tri-state phase frequency detector (PFD) and charge pump for use with the PLL of FIG. 1.
Figure 3:
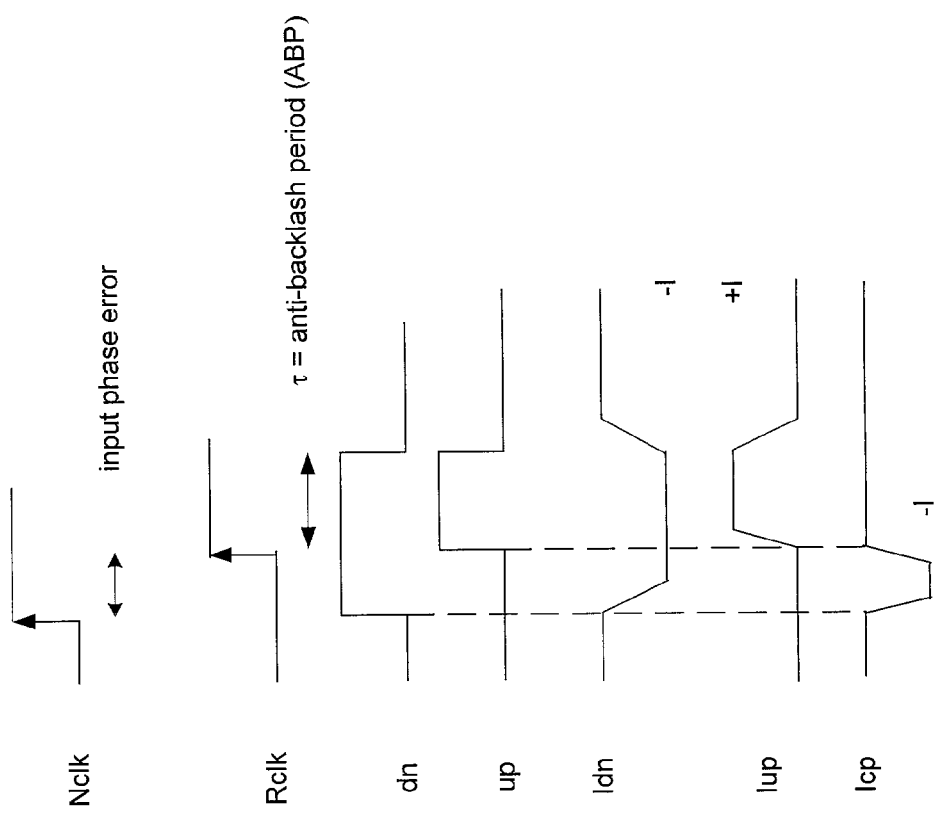
FIG. 3 shows the operation of the PFD and charge pump of FIG. 2 with perfectly matched up and down currents.
Figure 4:
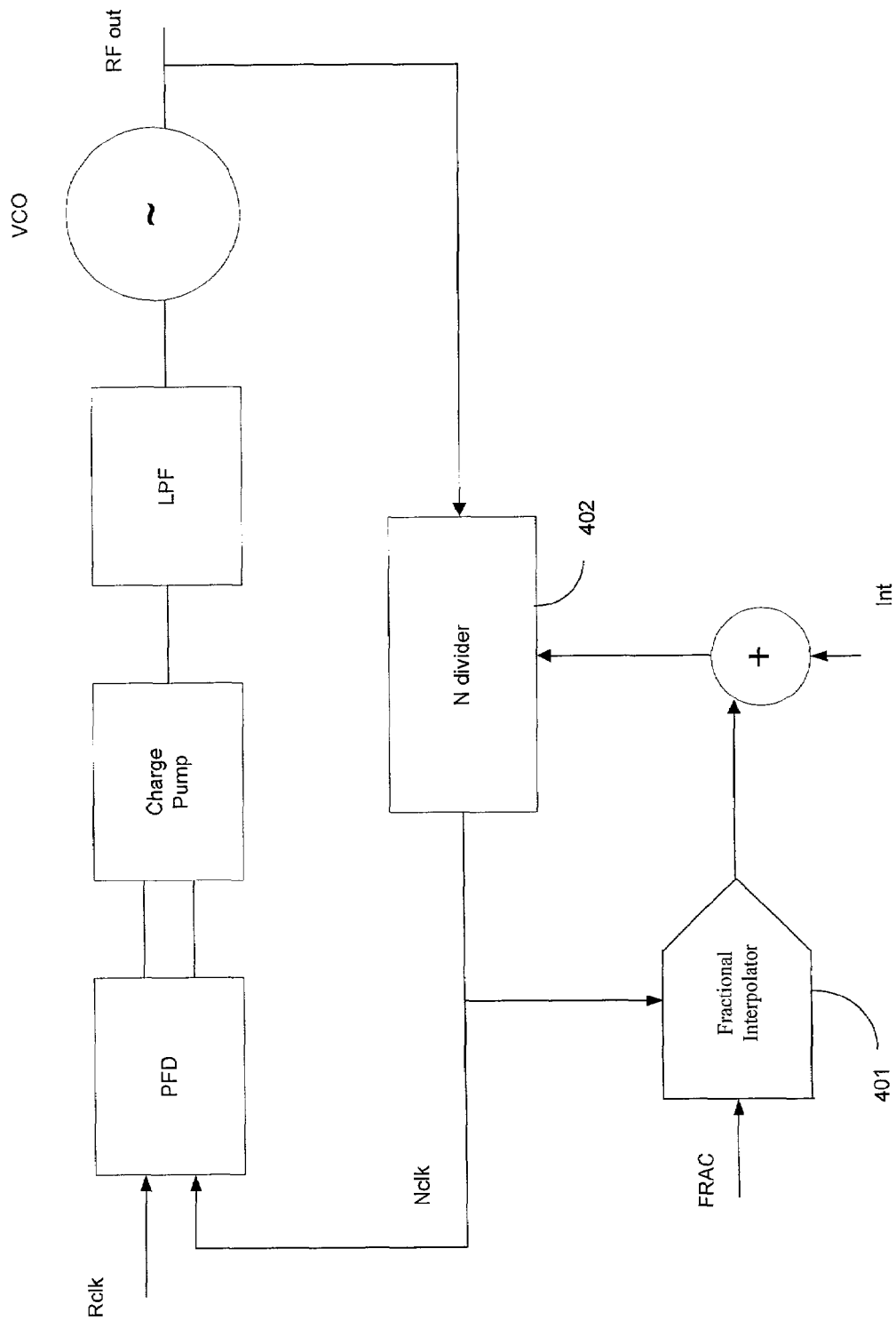
FIG. 4 shows a known Fractional-N PLL.
Figure 5:
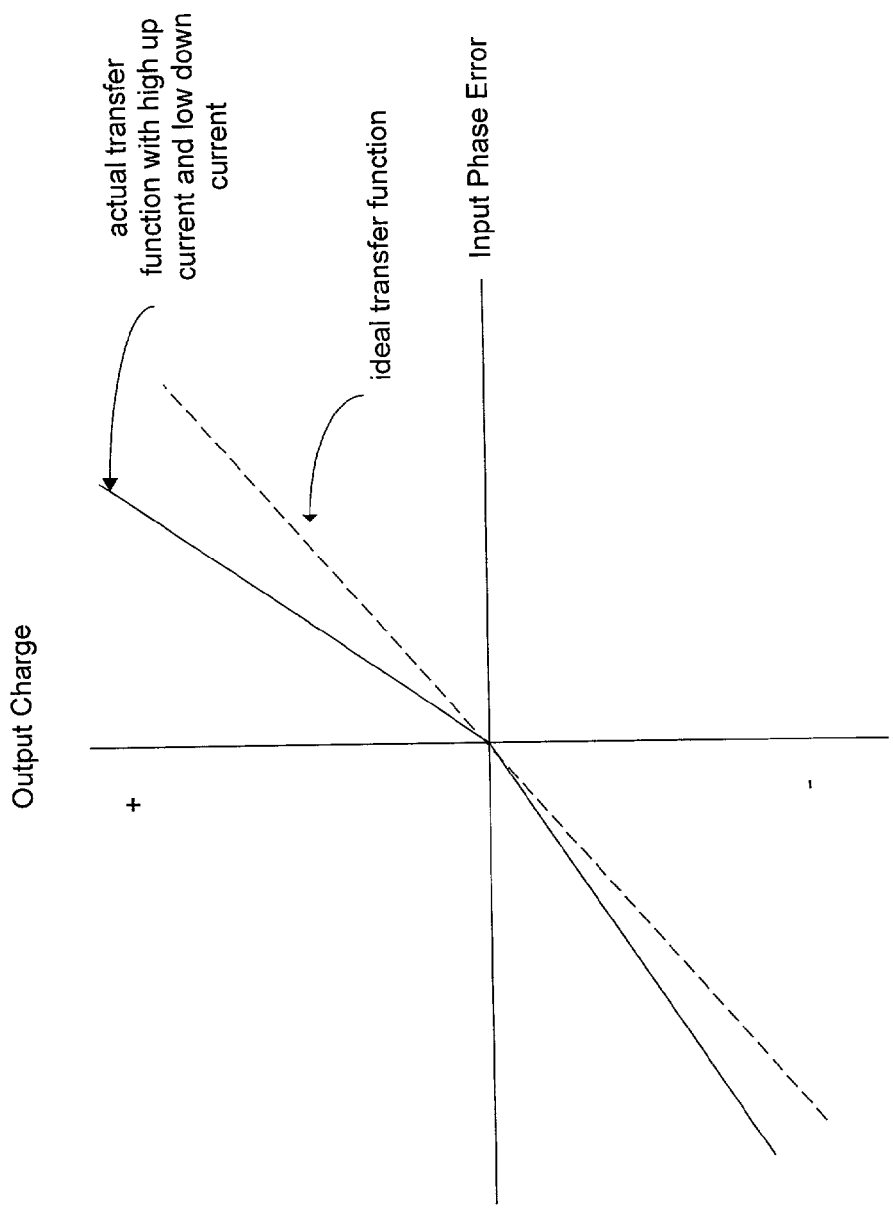
FIG. 5 shows a PFD transfer function with non-linearity due to mis-match.
Figure 6:
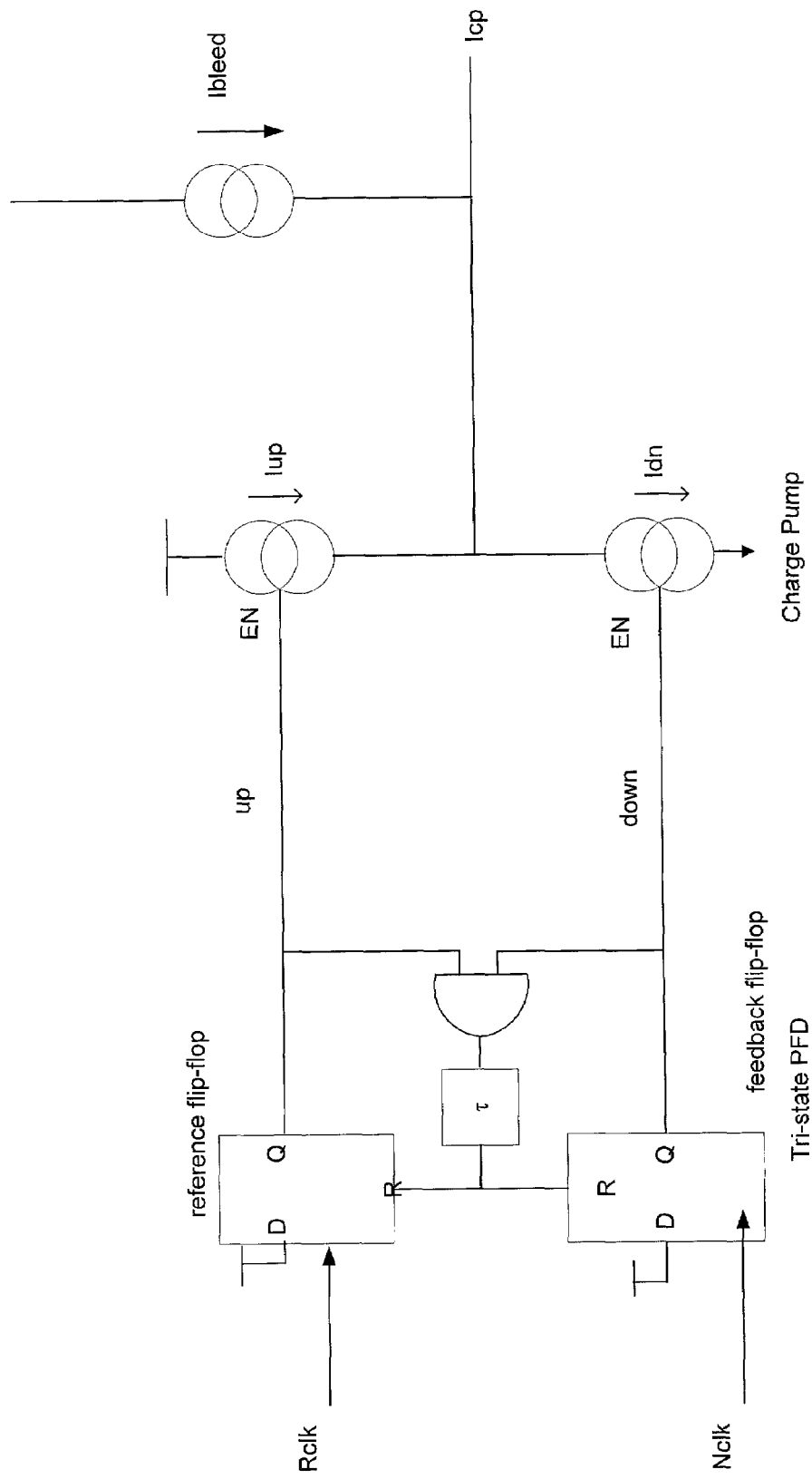
FIG. 6 shows a known PFD/charge pump with bleed current.
Figure 7:
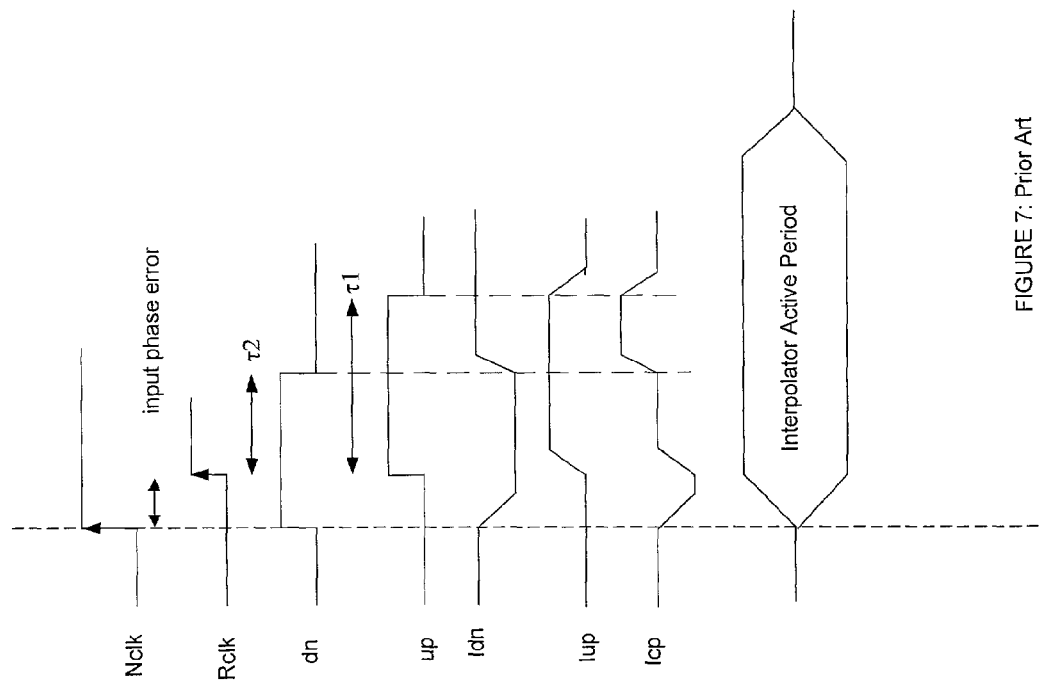
FIG. 7 shows a time sequence associated with an alternative prior art solution with a time delay introduced to the Rclk flip-flop.

It will be appreciated that the device of the present invention stretches the trailing edge of the "down" signal as shown in FIG. 9 (compared to FIG. 3). This results in the extra pulse of current as shown and thus extra charge to the LPF. The feedback loop acts to make the PFD/charge pump output, Icp, to zero on average. This forces the "up" leading edge to advance by the same amount that the "down" falling edge is delayed.

Figure 10:
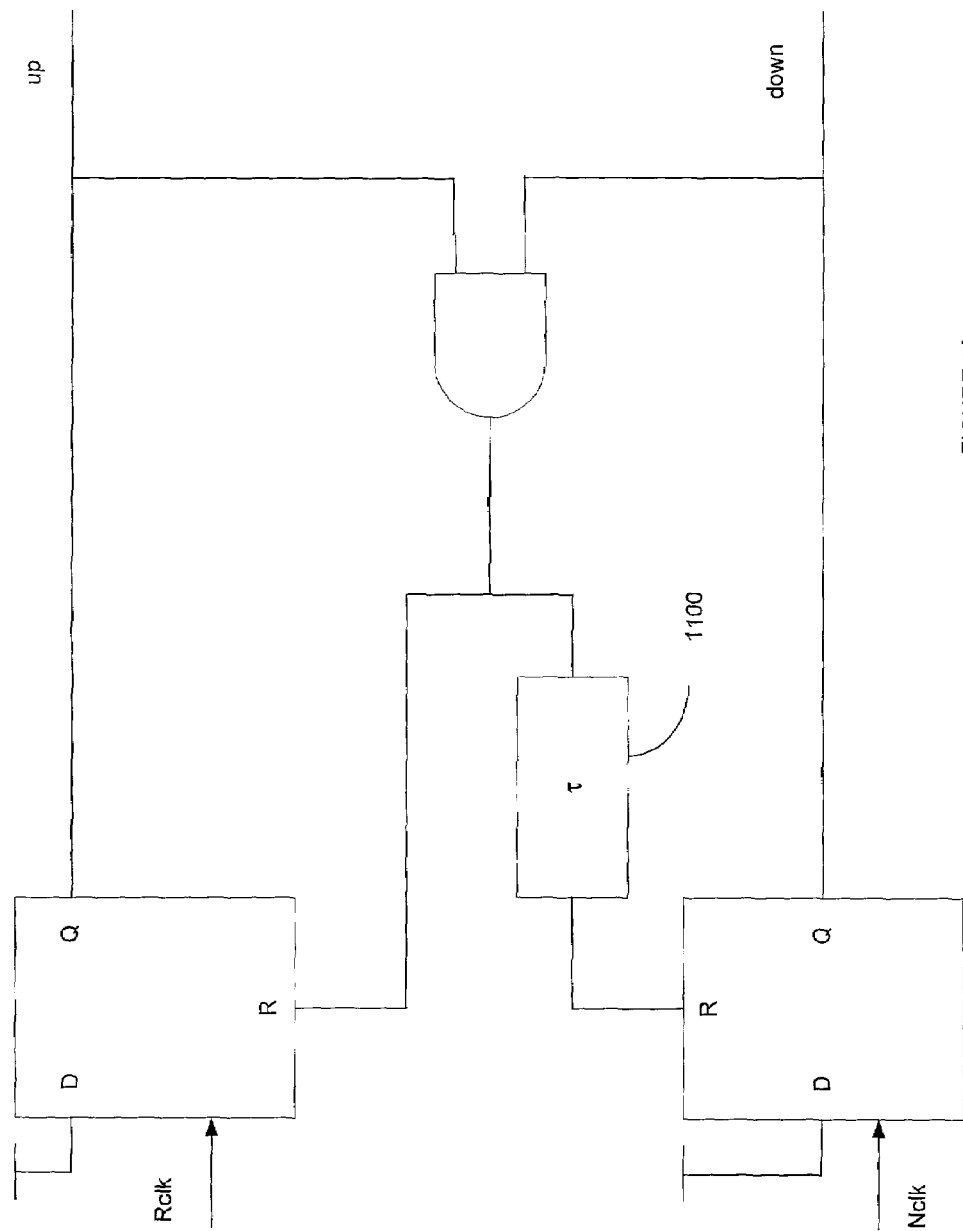
FIG. 10 shows a PFD with a phase offset means according to a second embodiment of the present invention.

FIG. 10 shows an alternative circuitry adapted to effect the introduction of a phase lag at the second flip flop. In this embodiment only one delay element (1100) is introduced after the AND gate. The output of the delay element (1100) is input to the reset element of the second flip flop, and no delay element is introduced between the AND gate output and the reset element of the first flip flop. As such the overall effect is the same as that implemented using the circuitry of FIG. 8; i.e., a time lag is introduced at the second flip flop relative to the first flip flop. Assuming that the up and dn outputs are zero, so as to effect an output current Icp as zero, the leading edge of Rclk will cause a low to high transition on "dn". When both "up" and "dn" are high the output of the AND gate will go high, resetting the "up" signal to low. A time □ later, the "dn" signal will reset to low. The timing sequence illustrated in FIG. 9 is equally applicable for this embodiment, the effect on the PLL circuitry being that the loop settles into a steady state with an average phase lag on Nclk's rising edge relative to Rclk being equivalent to the amount of the delay introduced in the Nclk flip flop's reset path.

By inserting the delay in the reset path to the Nclk flip flop the loop is forced to delay the Nclk edge relative to the Rclk edge and thus minimises the time that the activity of the interpolator overlaps with the charge pump activity.

Figure 11:
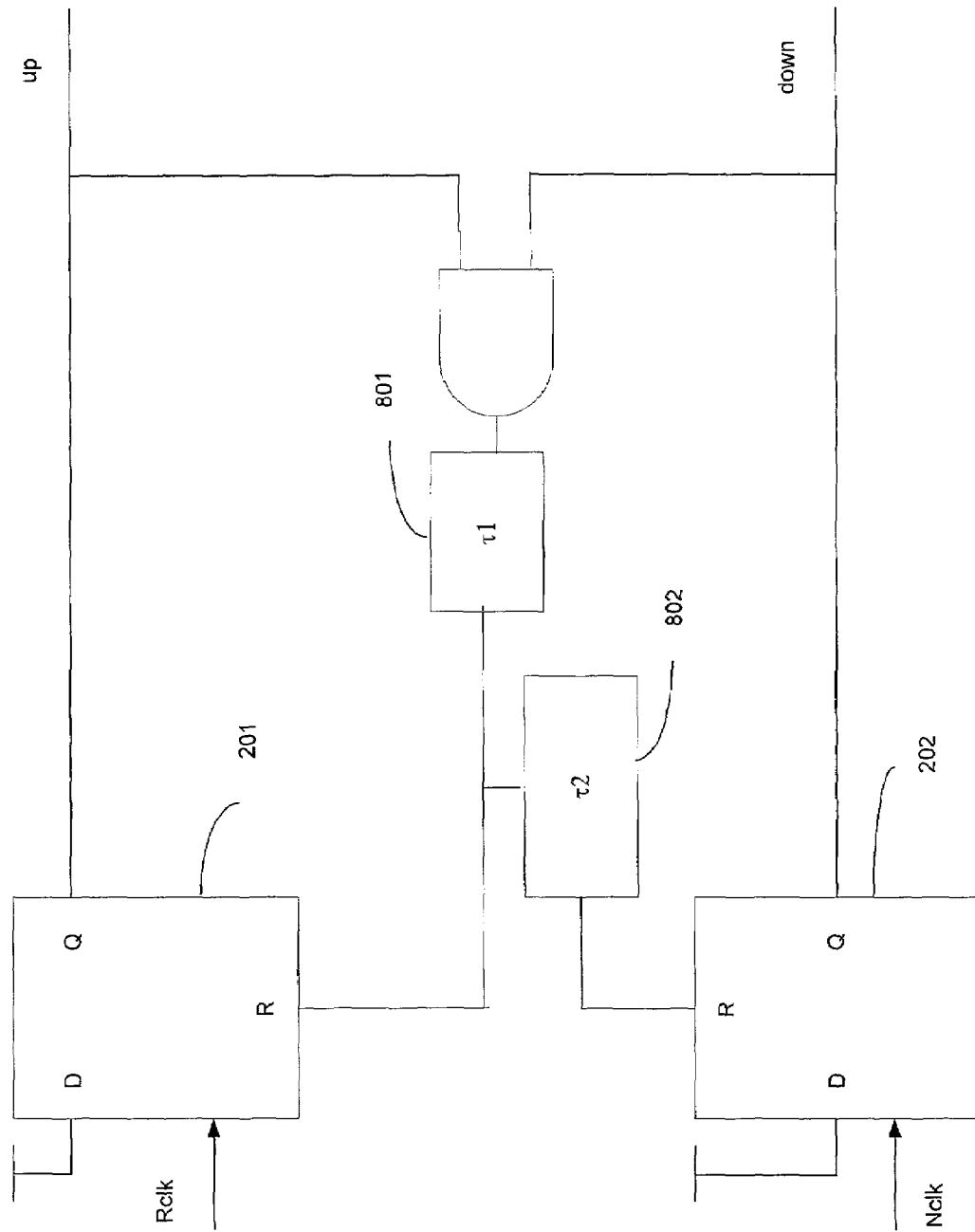
FIG. 11 shows a PFD with a phase offset means according to a third embodiment of the present invention.
Figure 12:
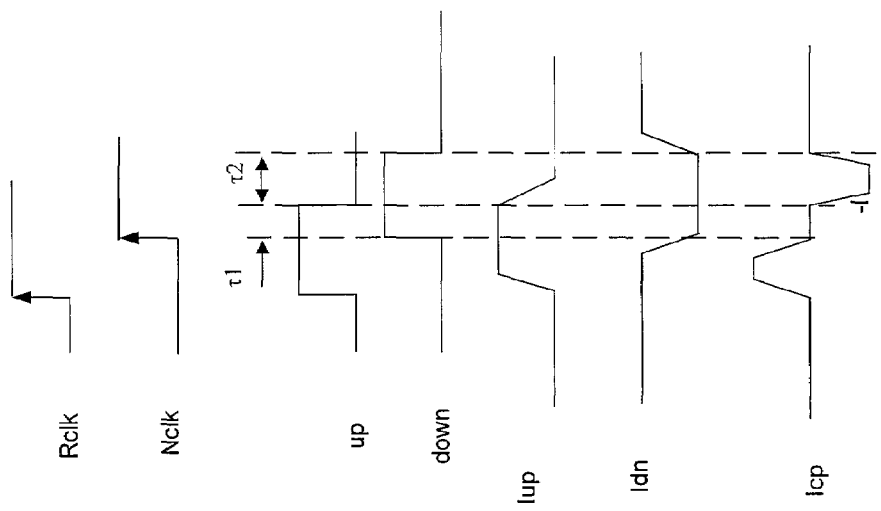
FIG. 12 is a timing sequence showing the operation of the device of FIG. 11.

It is also possible to achieve this effect of offsetting the activity of the interpolator away from the charge pump activity by utilising two delay elements as shown in FIG. 11. A common delay (801) is implemented after the AND gate, and is followed by a further delay (802) on the reset of the Nclk flip flop. The first delay (801) could represent a finite delay from R to Q of real flip flops as well as the delay through the AND gate. The finite delay element results in an altered timing sequence, as shown in FIG. 12, wherein there is an overlap of time when both the "up" and "dn" pulses are active.

Figure 13:
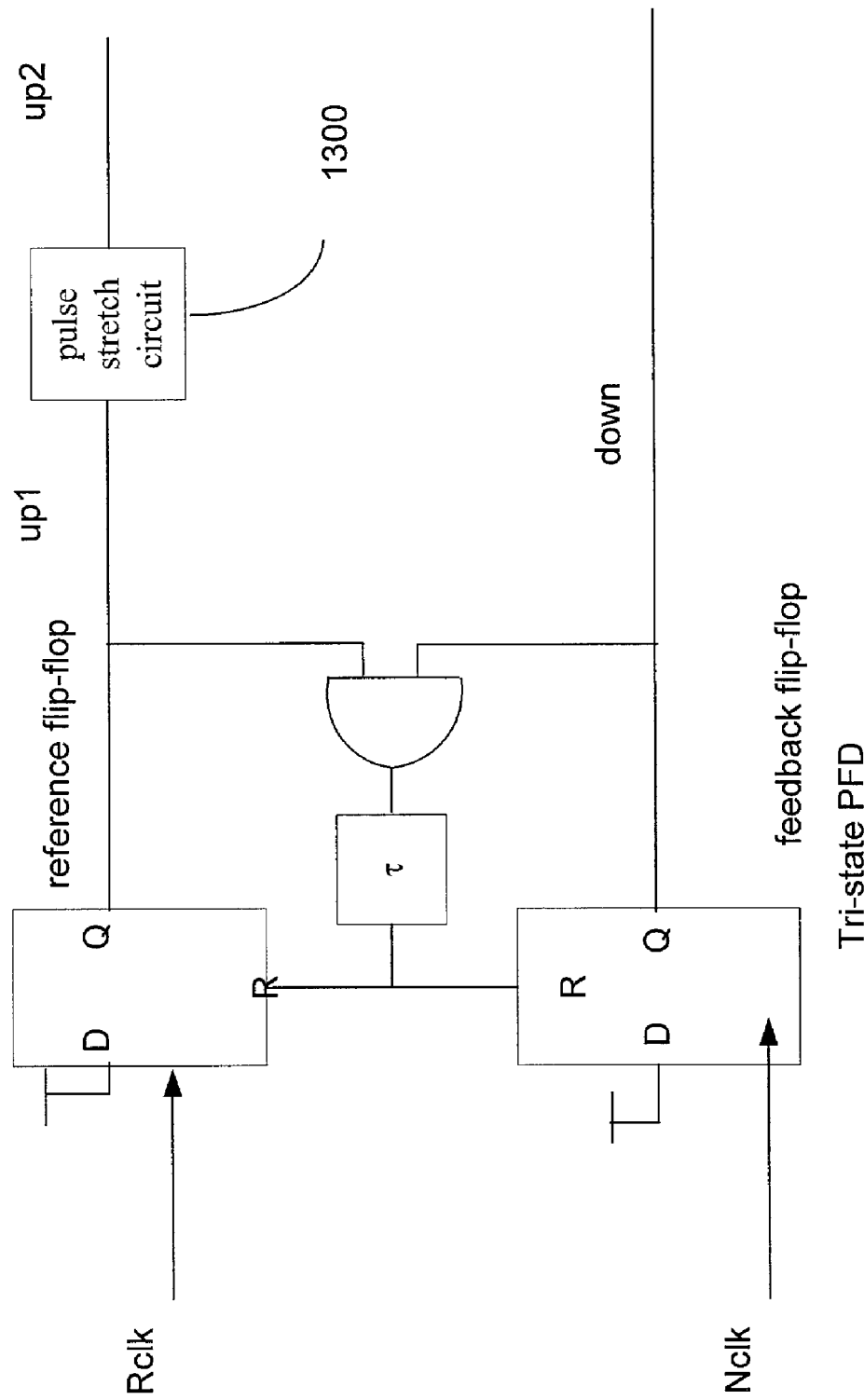
FIG. 13 shows a PFD with an up output pulse stretch circuit.

In accordance with an alternate embodiment of the present invention, an alternative way of introducing a phase offset at the PFD input is effected by a stretching of the trailing edge of one of the PFD outputs relative to the trailing edge of the other output by incorporating a pulse stretch circuit (1300) as shown in the example in FIG. 13. The charge offset at the output is given by the charge pump current times the extra amount the pulse is stretched. The loop tries to cancel error currents due to the output offset by introducing an equal and opposite offset between the PFD inputs.

Figure 14:
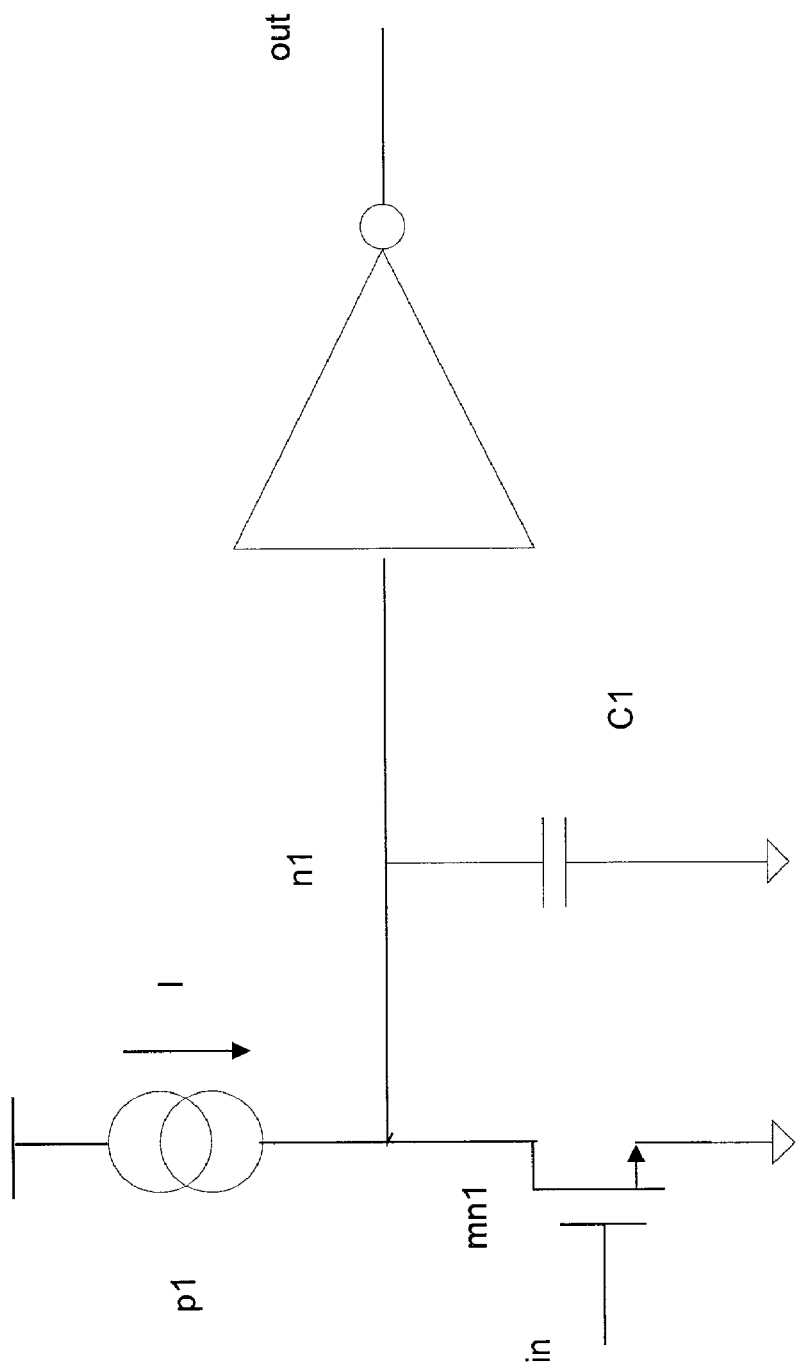
FIG. 14 is a detail of the pulse stretch circuit of FIG. 13.

For positive pulses, the pulse stretch circuit can be implemented as shown in FIG. 14. When the input goes high the mn1 turns on, quickly discharging C1. Node n1 is pulled to ground and out goes high. On the trailing edge, when the input transitions from high to low, mn1 is turned off and nil ramps up as C1 is charged up by the current source, p1. When n1 reaches V T the trip point of the inverter, the output then goes low. The time for the output to go low after the input has gone low is given by $$t=C \cdot V_T/I \quad (EQ\ 1)$$

The current I can be programmable to optimise the delay across different RF bands, with the optimum delay being just greater than the peak deviation of the interpolated phase on Nclk.

The timing diagram for the circuit of FIG. 14 is similar to those shown in the example in FIG. 9 result with $\tau 2=\tau$ and the time difference, $\tau 1-\tau 2$, generated by the pulse stretch circuit. As before, the loop acts to cancel error current due to this output offset by introducing and equal and opposite offset between the PFD inputs.

Figure 15:
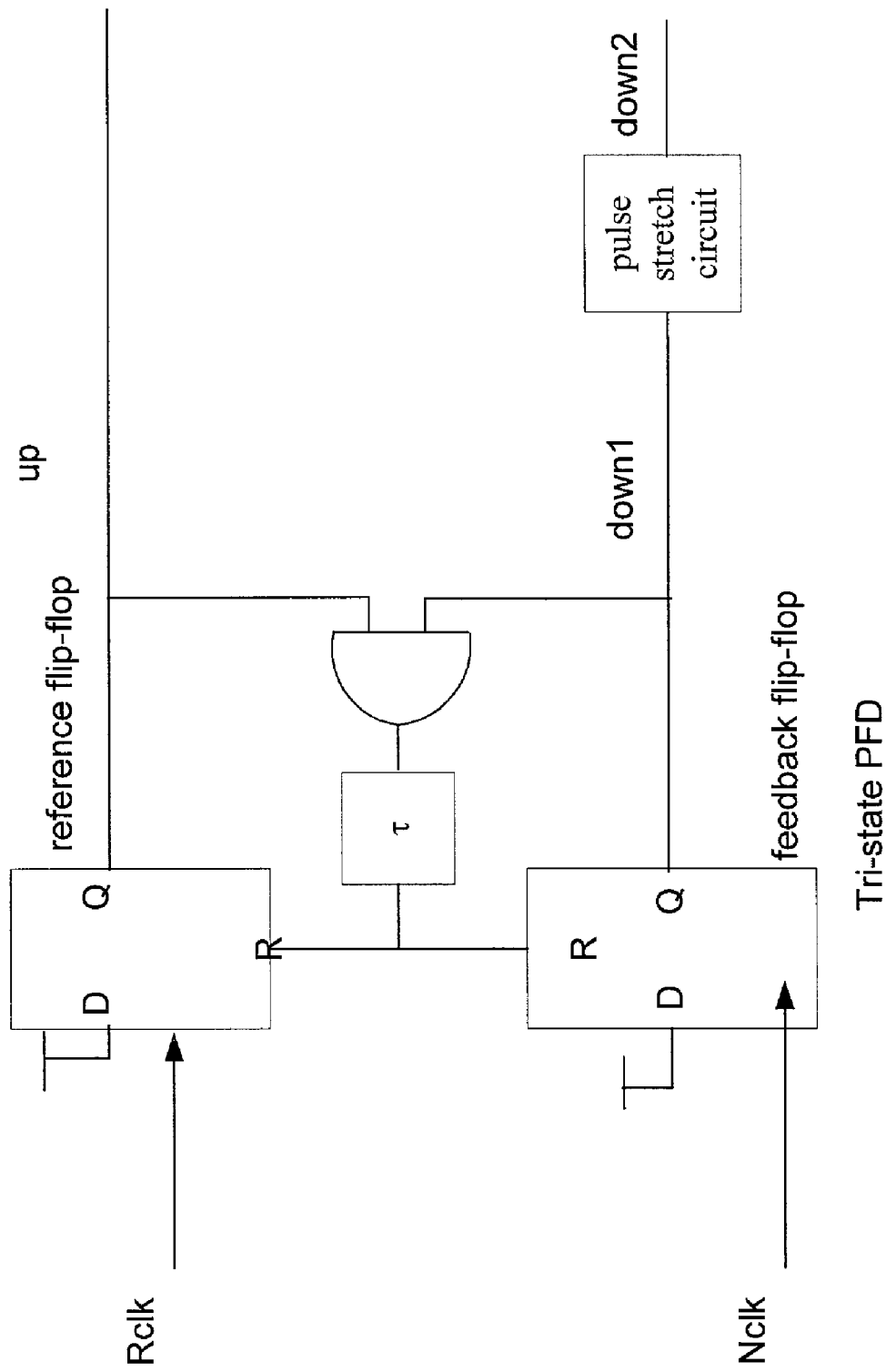
FIG. 15 shows a PFD with a down output pulse stretch circuit.

It will be appreciated that although described with reference to a positive pulse that a negative pulse may also be applicable, depending on the application. The utilisation on the down current enable is particularly applicable for fractional-N applications where the incorporation of the pulse stretch circuit on the "dn" signal path, as shown in FIG. 15 ensures that in closed loop, Nclk will lag Rclk.

The solution provided by present invention is superior to the prior art bleed current method because the phase offset is created using a short pulse (<4 RF cycles typically) of offset current. It can be arranged to gate this on at a time when there is minimal digital activity in the sigma-delta modulator and thus minimal substrate noise. It offers advantages over that disclosed in Gillig in that there is minimal overlap in the operation of the interpolator with the activity of the charge pump.

The words "comprises/comprising" and the words "having/including" when used herein with reference to the present invention are used to specify the presence of stated features, integers, steps or components but does not preclude the presence or addition of one or more other features, integers, steps, components or groups thereof.

There has been hereinbefore described a phase detection apparatus which is improved over the prior art. It will be appreciated by those skilled in the art that modifications may be made without departing from the spirit and scope of the invention. Accordingly, it is not intended to limit the invention to any one described embodiment as it will be appreciated by those skilled in the art that the invention should only be limited in view of the appended claims.

What is claimed is:

1. A phase lock loop apparatus having a reference signal input and an oscillator output, the apparatus comprising:
  a) a filter element having an input and an output,
  b) a controllable oscillator device having an input coupled to the output of the filter element and an output adapted to produce the oscillator output,
  c) a frequency dividing element having a first input coupled to the output of the oscillator output and an output for producing a feedback loop signal,
  d) a charge pump having two inputs and an output adapted to provide a phase difference signal as an input to the filter element, and
  e) a phase detection apparatus comprising:
    i) a first storage element having a clock input coupled to the reference signal input, a reset input and an output,
    ii) a second storage element having a clock input coupled to the loop feedback signal, a reset input and an output,
    iii) a logic element for logically combining the outputs of the first and second storage elements, the logic element having two inputs coupled to the outputs of the two storage elements and an output coupled to the reset input of the first storage element and the reset input of the second storage element, and
    iv) a stretching element for effecting a stretching of the trailing edge of the output of one of the first and second storage elements relative to the other storage element, and wherein the outputs of the first and second storage elements are coupled to the inputs of the charge pump.

2. The apparatus as claimed in claim 1 further comprising a first delay element coupled to the output of the logic element, the delay element having an output coupled to the reset element of the second storage element and a second delay element with an input coupled to the output of the logic element, the second delay element having an output coupled to the reset element of the first storage element and wherein the delay introduced by the second delay element to the first storage element is less than the delay introduced by the first delay element to the second storage element.

3. The apparatus as claimed in claim 1 further including a first delay element coupled to the output of the logic element, the delay element having an output coupled to the reset element of the second storage element and a second delay element coupled between the logic element and the first delay element, the output of the second delay element being coupled to the reset element of the first storage element and the input of the first delay element.

4. The apparatus of claim 1 wherein the logic element comprises a logic AND gate.

5. The apparatus of claim 1 wherein the two storage elements are flip flops.

6. The apparatus of claim 5 wherein the flip-flops are D type flip flops and further comprise data inputs coupled to a logic high.

7. The apparatus of claim 1 wherein the output of the first storage element and the output of the second storage element are coupled to a first current source having an enable input coupled to the output of the first storage element and a second current source having an enable input coupled to the output of the second storage element, the first and second current sources being coupled to form an output for the phase difference signal.

8. The apparatus as claimed in claim 1 wherein the phase detection apparatus is a tri-state phase frequency detector.

9. The apparatus as claimed in claim 1 wherein the relative delay between the trailing edges of the outputs of the first and second storage elements is programmable.

10. The apparatus as claimed in claim 9 wherein the relative delay is at least greater than a maximum deviation of the phase of the second storage element's clock input relative to the first storage element's clock input.

11. The phase lock loop apparatus as claimed in claim 1 wherein the frequency dividing element comprises an interpolator.

12. The apparatus as claimed in claim 1 further comprising:

a) a delay element coupled to the output of the logic element, the delay element having an output coupled to the reset input of at least one of the first and second storage elements.

13. The apparatus as claimed in claim 12 wherein the output of the delay element is coupled to the reset element of the first storage element.

14. The apparatus as claimed in claim 12 wherein the output of the delay element is coupled to the reset element of the second storage element.

15. The apparatus as claimed in claim 12 wherein the output of the delay element is coupled to the reset element of both the first and second storage elements.

16. The apparatus as claimed in claim 1 wherein the stretching element stretches the trailing edge output of the first storage element relative to the trailing edge output of the second storage element.

17. The apparatus as claimed in claim 1 wherein the stretching element stretches the trailing edge output of the second storage element relative to trailing edge output of the first storage element.

18. The apparatus as claimed in claim 1 wherein the stretching element is located at the output of the first storage element.

19. The apparatus as claimed in claim 1 wherein the stretching element is located at the output of the second storage element.

20. The apparatus as claimed in claim 1 wherein a delay in the trailing edge is programmable.

21. The apparatus as claimed in claim 20 wherein the delay is at least greater than the maximum deviation of the phase of the second storage element's clock input relative to the first storage element's clock input.

22. The apparatus as claimed in claim 1 having a reference signal and a loop feedback signal and wherein the reference signal is input to the clock input of the first storage element and the loop feedback signal is input to the clock input of the second storage element, and the provision of the stretching element for stretching the trailing edge of the output of one of the first and second storage elements enables the introduction of a compensatory phase offset at the input of the phase detection apparatus when the apparatus is used as a phase frequency detector in a phase lock loop.

23. The phase lock loop apparatus as claimed in claim 1 wherein the frequency dividing element is coupled to an interpolator.

24. The phase lock loop apparatus as claimed in claim 1 wherein the charge pump has a first input and a second input, the first and second inputs being coupled to the outputs of the first and second storage elements, respectively.

* * * * *